United States Patent
Brodsky

(10) Patent No.: US 7,466,154 B2
(45) Date of Patent: Dec. 16, 2008

(54) CONDUCTIVE PARTICLE FILLED POLYMER ELECTRICAL CONTACT

(75) Inventor: William Louis Brodsky, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/550,545

(22) Filed: Oct. 18, 2006

(65) Prior Publication Data

US 2008/0143356 A1 Jun. 19, 2008

(51) Int. Cl.
*G01R 31/02* (2006.01)
(52) U.S. Cl. ....................................... 324/754
(58) Field of Classification Search ................. 324/754; 174/262
See application file for complete search history.

(56) References Cited

U.S. PATENT DOCUMENTS

| | | | | | |
|---|---|---|---|---|---|
| 4,705,205 | A | * | 11/1987 | Allen et al. | 228/180.22 |
| 5,061,192 | A | * | 10/1991 | Chapin et al. | 439/66 |
| 5,558,271 | A | * | 9/1996 | Rostoker et al. | 228/180.22 |
| 5,640,052 | A | * | 6/1997 | Tsukamoto | 257/781 |

* cited by examiner

*Primary Examiner*—Ha Nguyen
*Assistant Examiner*—Shaun Campbell
(74) *Attorney, Agent, or Firm*—Robert W. Lahtinen

(57) ABSTRACT

A conductive filled polymer contact which is molded at an aperture through a carrier sheet includes an elongated conductive frame introduced prior to the molding process as an insert which is held captive in the molded contact and which extends from at or near the upper contact surface, through the aperture and terminates at the opposite end at or near the lower contact surface to provide a continuous conductive path through the length of the contact, whereby the sequence of particle to particle interfaces within the molded polymer contact is reduced in number to increase reliability.

17 Claims, 2 Drawing Sheets

CONDUCTIVE PARTICLE FILLED POLYMER ELECTRICAL CONTACT

FIELD OF THE INVENTION

This invention pertains to electrical connectors and more particularly to conductive particle filled elastomer contacts mounted on an interposer.

BACKGROUND OF THE INVENTION

The performance requirements of modern electronic systems has required the use of increased interconnect contact densities. For high density connector array applications, a common connector of choice is the land grid array (LGA) connector to achieve direct electrical interconnection between such typical devices as a module and a printed circuit board. Electrical engagement between the contact array of the module and the mating contact array presented by the circuit board is enabled by a contact carrying interposer, wherein connection is effected by aligning the interposer contact array with the respective mating surfaces of the module and circuit board and applying a clamping force to mechanically compress the interposer between module and circuit board.

The contacts mounted on the interposer must be closely adjacent one another to comply with the density of the aligned grids on the component and circuit board which are to be connected. While meeting the density requirement, the individual contacts must provide a reliable electrical connection between the confronting device contact surfaces and be wholly isolated from the adjacent contacts to preclude any shorting between signal lines. This must be accomplished despite any relative movement resulting from the variation of the coefficients of thermal expansion of the module and circuit board.

Several types of LGA interposer contacts are used including metal springs, fuzz buttons (a column of kinked, wadded wire filaments) and conductive elastomers. The present invention is an improvement of the conductor filled elastomer contacts.

SUMMARY OF THE INVENTION

The present invention is directed to conductive filled polymer (CFP) contacts wherein a grid of contacts is created through transfer molding of a base elastomer that has been mixed with a curing agent and conductive particles. The LGA interposer is formed by molding conductive filled polymer contacts at apertures in an electrically insulating carrier sheet that is interposed between the mold portions during the molding sequence. The interposer is used to connect two arrays of contact surfaces typically presented by a module and a printed circuit board on which the module is to be mounted. The contact surface interconnections are established by clamping the module to the circuit board (with the interposer therebetween) with a force of sufficient magnitude to compress each interposer contact between the confronting contact surfaces to ensure electrical interconnection. Although the force required to be applied to each contact may be only 1 to 4 ounces, a grid of a few thousand contacts can require a significant compressive force.

Conductive particle filled polymer contacts are a common contact structure of choice. Such contacts are subject to the occasional occurrence of a glitch caused by an interruption of particle to particle electrical contact. Although the occurrence of a glitch is infrequent, in a grid including thousands of contacts which must always provide a reliable electrical path, even rare occurrences are not acceptable. A typical condition that may cause a glitch is the difference between the coefficients of thermal expansion of the module and the printed circuit board which are being interconnected. The differing coefficients can introduce a substantial lateral shear force which can cause particle to particle electrical contact to be interrupted or glitch. The present invention discloses a means to reduce the risk of glitching.

The glitching problem is reduced and the reliability of the conductive filled elastomer contact is enhanced by a conductive frame which is introduced into the mold cavity, prior to the molding of the contact, as an insert extending through the carrier aperture to provide a conductor extending from adjacent one contact surface on the contact body to the other contact surface on the contact body. The reliability of a CFP contact can be estimated based on the number of particle contact interfaces in parallel versus the number of particle contacts in series. With a conductive filled polymer there are many contacts across any given cross section of the CFP contact. For contacts having the same height and diameter with particles of uniform size, the ratio of the parallel to series contacts would be one or the contact reliability would be that of a single interface. However, since a contact bodies height is greater than the diameter, the ratio will actually be greater than one meaning the contact reliability has actually been reduced (i.e. the failure rate has been increased).

Use of a conductive frame reduces the number of series electrical connections between the contact upper and lower surfaces which engage the device contact surfaces to be interconnected. The presence of a conductive frame extending through the length of the contact provides a reliable electrical path through the length of the contact. The path between the contact surfaces being connected (the height of the connector) can be 8 to 10 times the length of the path to the conductive frame. The short particle to particle electrical path to the conductive frame increases contact reliability by effectively reducing the number of connector particle interfaces through the contact height. This reduces the contact bulk resistance through the contact height.

The conductive frame does not have to have spring properties since the contact body elastic properties are controlled by the elastomer properties. This means the electrical conductivity of the conductive frame base material can be pure copper or other highly conductive malleable material. Inclusion of a conductive frame increases the reliability achieved by reducing the dependence on particle surface contacts and further enables smaller contact cross sectional size and closer contact spacing.

DETAILED DESCRIPTION

Figure 1:
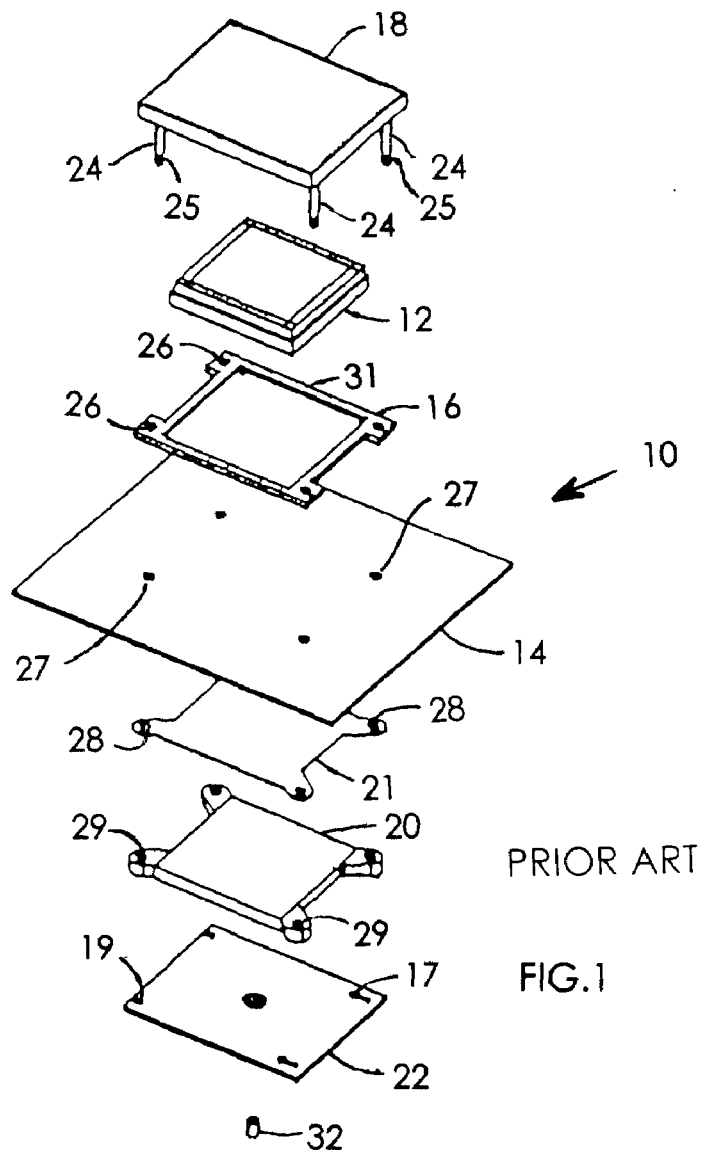
FIG. 1 is an exploded view, illustrating a typical of a land grid array socket hardware.
Figure 2:
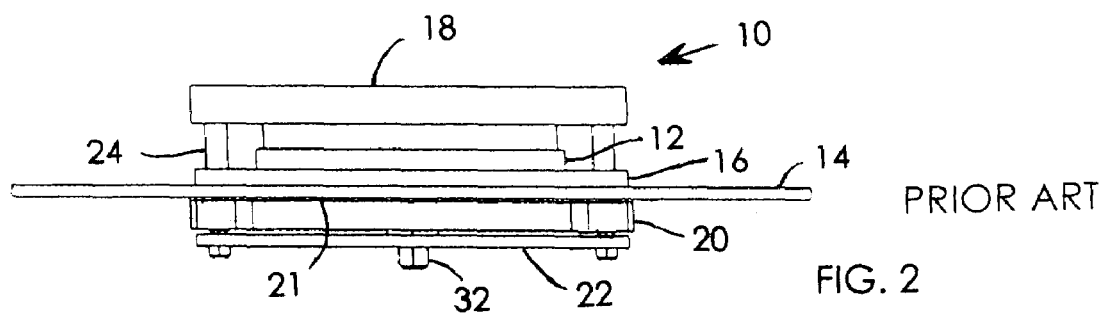
FIG. 2 is an assembled elevation of the socket hardware of FIG. 1.

FIGS. 1 and 2 illustrate a typical land grid array (LGA) socket assembly 10. FIG. 1 is an exploded view of the assembly and FIG. 2 is an assembled view of the elements of FIG. 1. The LGA module 12 carries a pattern or grid of contact surfaces on the lower surface which confronts the printed circuit board 14 that carries a pattern or grid of contact surfaces adapted to be aligned with and electrically connect the module to the circuits on the printed circuit board. The electrical connection is effected by an LGA interposer with a pattern or grid of contacts which are aligned between the LGA module contact surfaces and the printed circuit board contact surfaces. Each interposer contact extends through and is captured at an aperture in the electrically insulating interposer carrier substrate and is conductive and compressible to establish an electrically conductive path between the confronting contact surfaces presented by the module 12 and the printed circuit board 14. A rigid upper stiffener 18 engages the upper surface of LGA module 12 and a rigid backside stiffener 20 abuts the lower surface of printed circuit board 14. Backside stiffener 20 is electrically isolated from printed circuit board 14 by a backside insulator 21. Beneath the backside stiffener 20 is a spring plate 22. Load posts 24, secured to the upper stiffener 18, pass respectively through apertures 26 in the LGA interposer 16, apertures 27 in the printed circuit board 14, apertures 28 in the backside insulator 21, apertures 29 in the backside stiffener 20 and are affixed to the spring plate 22 to secure the LGA module 12 to the printed circuit board 14 and align the connector grid on the interposer 16 with the grid of contact surfaces on printed circuit board 14. The spring plate 22 slides laterally onto load posts 24 allowing keyhole openings 17 and open ended slots 19, formed in the spring plate, to engage peripheral grooves 25 in the load posts. The LGA module grid of contact surfaces is aligned with the respective interposer contacts by the interposer marginal frame portion 31 that surrounds the LGA module 12 in the assembled condition of FIG. 2. The compressive force that urges the LGA module 12 toward the printed circuit board 14 is effected the load screw 32 which extends through a threaded opening in spring plate 22 and engages backside stiffener 20.

Figure 3:
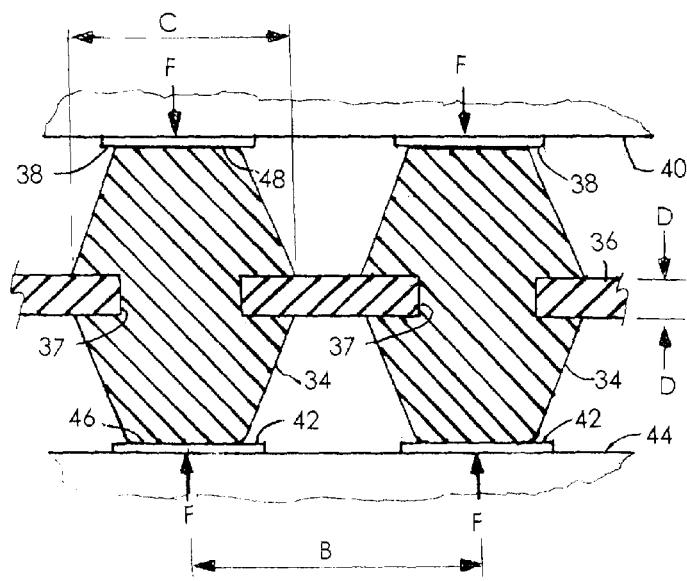
FIG. 3 is a section view of two adjacent conductive filled polymer contacts taken along a plane defined by the center lines of the contacts shown in cooperation with portions of the module and circuit board interconnected by the contacts.

FIG. 3 is a sectional view which illustrates a pair of typical prior art conductive filled polymer (CFP) contacts 34 mounted on a polyimide carrier sheet 36 at apertures defined by cylindrical walls 37. Contacts 34 are compressed between pads or contact surfaces 38 at the surface of module 40 and the pads or contact surfaces 42 presented by printed circuit board 44 by a force F which is applied using a socket assembly such as that shown in FIGS. 1 and 2. The contacts 34 are each formed as a polymer body filled with metal particles that have a concentration that causes particles to engage adjoining particles and establish a conductive path from the lower surface 46 to the upper surface 48. The lower surface 46 is the contact body surface below and most remote from the carrier sheet 36 which, as shown, engages the printed circuit board contact surface 42. Similarly, upper surface 48 is the contact body surface above and most remote from the carrier sheet 36. The conductive filler is commonly silver powder. The contacts are formed by transfer molding and are held captive at apertures in the polyimide carrier 36 by enlarged diameter portions adjacent the carrier.

Figure 4:
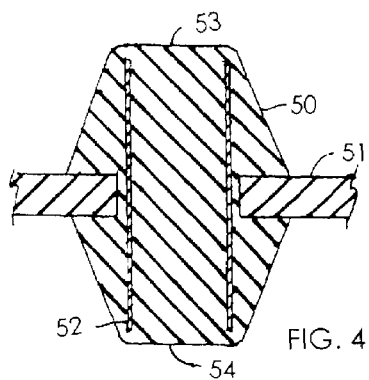
FIG. 4 is a section view of a conductive filled polymer contact taken through the vertical center line of the contact which includes the conductive frame of the invention.
Figure 7:
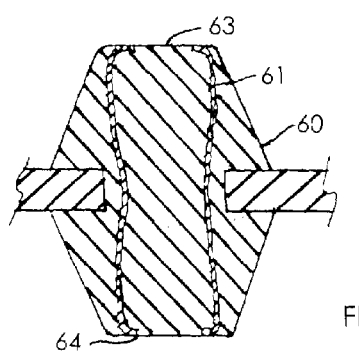
FIG. 7 illustrates a second embodiment of the invention which employs a conductive frame which is longer than the height of the molded contact.

The showings of FIGS. 3, 4 and 7 are greatly enlarged for illustration. In current practice, typical contacts 34 have an overall height and pitch between contacts (arrow B) of 1.0 mm and a diameter adjoining the carrier of 0.7 mm. The carrier sheet thickness (arrows D-D) is about 0.125 mm.

FIG. 4 shows a contact 50 molded at an aperture in carrier sheet 51 which includes the conductive frame 52 of the present invention. The conductive frame 52 is inserted in the mold cavity prior to the transfer molding of the conductive filled polymer contact to become an insert captured in the completed contact. Since the conductive frame is captured within the polymer contact body, manufacturing tolerances are controlled by the polymer molding process, not the conductive frame manufacturing process, placement or deformation. Signal integrity is also controlled by the molding process. The contact surface is conductive and controls the electrical characteristics with respect to the next adjacent contacts. The conductive frame may be formed of any highly conductive material. Since the elastomer forming the body of the contact, rather than the frame, provides the compressive and elastic characteristics of the contact, the frame may be formed of pure copper or another malleable metal conductor.

Figure 5:
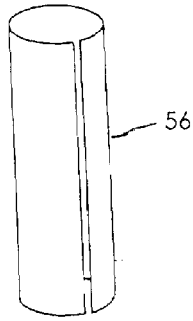
FIGS. 5 and 6 show embodiments of the conductive frame used in the practice of the invention.
Figure 6:
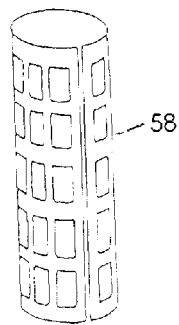

The conductive frame 52 may take many physical forms. For example, it may be a cylindrical conductor, a continuous sheet formed as a split cylinder 56 (as seen in FIG. 5), a split cylinder 58 which has an apertured wall (as in FIG. 6), formed of metal screen material, or other configuration that serves as an elongated conductor providing a continuous conductive path. The conductive frame functions to provide a continuous conductive path from adjacent the contact top surface 53 to adjacent the contact bottom surface 54. Since the conductive particle to particle path from either top surface 53 or bottom surface 54 is shorter to frame 52 than between top surface 53 and bottom surface 54, the reliability of the contact is enhanced. The use of a tubular conductor frame 53, in the form of a single piece cylinder, split cylinder or a perforate form of either having a generally circular cross section, optimizes the reduction of the length of particle to particle conductive paths to the frame's continuous conductive path. The reduced contact bulk resistance that provides improved reliability can also be utilized to reduce both the contact diameter and the pitch between contacts to achieve greater contact density when required.

FIG. 7 shows a second embodiment of the invention wherein the conductive frame, that is captured as an insert in the molded contact, is longer than the height of the molded contact. The longer conductive frame 61 engages the top and bottom of the mold to form a continuous conductive path from the top surface 63 to bottom surface 64. To further accommodate its length, the conductive frame 61 can be formed to encourage buckling at the mid portion or could be prebuckled. This form of conductive frame would further assure a reliable electrical path through the contact length by an even greater reduction of the required particle to particle contact.

While the invention has been shown and described with reference to preferred embodiments thereof, it will be understood that various changes in form and details may be made therein without departing from the spirit and scope of the invention. For example, the conductive frame could take many shapes other than those shown and described, such as a helical coil, twisted rectangle or other shape that provides the conductive path through the contact and is compatible with the compression or transfer molding of the contact.

What is claimed is:

1. A resilient conductive filled polymer contact for placement and compressive retention between conductive surfaces to be electrically interconnected, to establish a conductive path between and high pressure connections with such conductive surfaces comprising:

a planar carrier with an aperture therethrough;

a conductive filled, resilient polymer contact body extending through said aperture and presenting enlarged portions at each side of said carrier, whereby said contact body is held captive at said carrier aperture;

said contact body presenting oppositely facing surfaces at each side of said carrier on said body portion most remote from said carrier; and an electrically conductive, tubular frame member within said body portion, substantially surrounded and filled by said body portion conductive filled polymer, with said conductive filled polymer material continuously electrically engaging both the interior and exterior tubular frame member surfaces which are disposed between said contact body oppositely facing surfaces and extending through said carrier aperture with ends terminating respectively adjacent said oppositely facing surfaces.

2. The conductive filled polymer contact of claim 1 wherein said conductive, tubular frame member is a single piece tubular element having a generally circular cross section.

3. The conductive filled polymer contact of claim 2 wherein said conductive, tubular frame member is formed of a malleable copper material.

4. A resilient conductive filled polymer electrical contact for placement and compressive retention between conductive surfaces to be electrically interconnected, to establish a conductive path between and high pressure connections with such conductive surfaces, comprising:

a planar carrier sheet with an aperture therethrough;

a conductive filled, resilient polymer contact body secured at said aperture with portions extending at each side of said carrier sheet, whereby said contact body is held captive to said carrier sheet at said aperture; and an electrically conductive tubular frame which extends through said aperture and is retained as an insert in said contact body and substantially surrounded and filled by said contact body conductive filled polymer with said conductive filled polymer material continuously electrically engaging both the interior and exterior frame member surfaces within said contact body.

5. The conductive filled polymer electrical contact of claim 4 wherein said contact body has upper and lower surfaces which are respectively the contact surfaces most remote from said planar carrier at each side thereof and said conductive tubular frame extends from adjacent said upper contact body surface to adjacent said lower contact body surface.

6. The conductive filled polymer electrical contact of claim 5 wherein said conductive tubular frame has a length that is less than the distance between said contact body upper surface and said contact body lower surface.

7. The conductive filled polymer electrical contact of claim 6 wherein said conductive tubular frame is formed of a malleable metal material.

8. The conductive filled polymer electrical contact of claim 7 wherein said conductive tubular frame is a generally cylindrical metal element.

9. The conductive filled polymer electrical contact of claim 8 wherein said conductive tubular frame is formed of a malleable copper material.

10. The conductive filled polymer electrical contact of claim 4 wherein said contact body has upper and lower surfaces which are respectively the contact body surfaces most remote from said planar carrier sheet at each side thereof and said conductive tubular frame extends from said body upper surface to said contact body lower surface.

11. The conductive filled polymer electrical contact of claim 10 wherein said conductive tubular frame has an initial length that is greater than the distance between said contact body upper surface and said contact body lower surface, whereby said conductive frame is deformed at said contact body upper surface and said contact body lower surface when said conductive filled, resilient polymer contact body is placed between the conductive surfaces to be electrically interconnected.

12. The conductive filled polymer electrical contact of claim 11 wherein said conductive tubular frame is formed of a malleable metal which is prebuckled to enable deformation.

13. The conductive filled polymer electrical contact of claim 12 wherein said contact body is formed of a conductive particle filled molded polymer and said conductive tubular frame is a substantially cylindrical malleable metal member.

14. An electronic equipment electrical connection assembly comprising:

first and second electrical circuit members;

first and second conductive surfaces respectively presented by said first and second electrical circuit members;

said first and second conductive surfaces being in substantially parallel, spaced, aligned relation to one another;

a planar carrier sheet with an aperture therethrough;

a conductive filled polymer contact body secured and held captive at said aperture with portions projecting at each side of said carrier sheet;

said conductive filled contact body having upper and lower surfaces which are respectively the contact body surfaces most remote from said carrier sheet;

an electrically conductive, substantially tubular frame, retained in said contact body, that extends through said aperture with the ends terminating adjacent said upper and lower surfaces respectively and which is surrounded and filled by said conductive filled polymer such that the inner and outer conductive tubular frame surfaces are in continuous contact with said conductive filled material throughout the length of said conductive tubular frame between said upper and lower surfaces;

said carrier sheet being positioned between said first and second electrical circuit members with said contact body upper and lower surfaces respectively engaging said first and second conductive surfaces; and clamping means urging said first and second electrical circuit members toward one another, clamping said conductive filled contact body therebetween and establishing high pressure electrical contact between said connector body upper surface and said first conductive surface and between said connector body lower surface and said second conductive surface.

15. The electronic equipment electrical connection assembly of claim 14 wherein said conductive tubular frame is a generally cylindrical metal element.

16. The electronic equipment electrical connection assembly of claim 15 wherein said conductive tubular frame is formed of a malleable copper material.

17. The electronic equipment electrical connection assembly of claim 16 wherein said conductive tubular frame is prebuckled to enable ready deformation when said conductive filled polymer body is clamped and compressed between said first and second conductive surfaces.

* * * * *